(12) United States Patent
Kowalik

(10) Patent No.: US 11,047,888 B1
(45) Date of Patent: Jun. 29, 2021

(54) HIGH VOLTAGE THREE PHASE CURRENT AND VOLTAGE SENSOR ASSEMBLY SYSTEM WITHOUT GROUND CONNECTION AND METHOD

(71) Applicant: CLEAVELAND/PRICE INC., Trafford, PA (US)

(72) Inventor: Peter M. Kowalik, Trafford, PA (US)

(73) Assignee: CLEAVELAND/PRICE, INC., Trafford, PA (US)

( * ) Notice: Subject to any disclaimer, the term of this patent is extended or adjusted under 35 U.S.C. 154(b) by 10 days.

(21) Appl. No.: 16/748,948

(22) Filed: Jan. 22, 2020

(51) Int. Cl.
| | |
|---|---|
| *G01R 19/22* | (2006.01) |
| *H02J 13/00* | (2006.01) |
| *G01R 31/58* | (2020.01) |
| *G01R 15/18* | (2006.01) |
| *G01R 15/20* | (2006.01) |

(52) U.S. Cl.
CPC ............ *G01R 19/22* (2013.01); *G01R 15/18* (2013.01); *G01R 15/202* (2013.01); *G01R 31/58* (2020.01); *H02J 13/00002* (2020.01)

(58) Field of Classification Search
CPC ........ G01R 19/22; G01R 15/18; G01R 31/58; G01R 15/202; H02J 13/00002
USPC .................................... 324/119, 76.11, 550
See application file for complete search history.

(56) References Cited

U.S. PATENT DOCUMENTS

| | | | |
|---|---|---|---|
| 9,664,710 B2 | 5/2017 | Roberson | |
| 9,746,498 B2 | 8/2017 | Roberson | |
| 9,810,720 B2 * | 11/2017 | Roberson | ............. G01R 15/181 |
| 9,881,755 B1 * | 1/2018 | Cleaveland | ............ H01H 33/16 |
| 9,899,166 B1 * | 2/2018 | Shychuck | .............. H01H 31/04 |

OTHER PUBLICATIONS

Cleaveland/Price Inc. Bulletin DB50C18, entitled "LineScope Smart Power Monitor", 6 pages.

\* cited by examiner

*Primary Examiner* — Giovanni Astacio-Oquendo
(74) *Attorney, Agent, or Firm* — Ronald S. Lombard

(57) ABSTRACT

A sensor assembly system and method for providing good voltage accuracy for monitoring a three phase high voltage power line without connecting to ground. The sensor assembly system comprises three sensor assemblies having reference point ends not connected to ground. All three sensor assemblies are connected together at the reference point ends to create a neutral common reference point not connected to ground potential that is at zero volts when all of the three phases are at the same line voltage.

23 Claims, 9 Drawing Sheets

HIGH VOLTAGE THREE PHASE CURRENT AND VOLTAGE SENSOR ASSEMBLY SYSTEM WITHOUT GROUND CONNECTION AND METHOD

BACKGROUND OF THE INVENTION

This disclosure relates to an improved current and voltage sensor assembly system and method for monitoring a high-voltage three-phase power line without connecting to ground. Many high voltage sensors have no connection to ground and have no definitive reference point relative to the high-voltage line. These types of high voltage sensors may yield inaccurate values for voltage even if their current measurements are accurate. The present invention provides a stable reference point not connected to ground relative to the three phase power lines and thus overcomes the inherent inaccuracies of these other ungrounded systems that have no definitive reference point relative to the high-voltage line. The present invention also provides a method for powering the current and voltage sensor assemblies through the stable reference point.

Two systems that use sensor assemblies that are connected to ground are disclosed in U.S. Pat. No. 9,664,710 B2, issued on May 30, 2017, and assigned to Cleaveland/Price Inc., the present assignee and in U.S. Pat. No. 9,746,498 B2 issued on Aug. 29, 2017 and assigned to Cleaveland/Price Inc. The sensor assemblies use resistors connected in series to ground to make connection to a solid reference point to obtain extremely accurate voltage measurements. These sensor assembly systems monitor phase currents, and phase to ground voltages and are capable of calculating phase to phase voltages and ground currents on three phase power lines. However, these sensor assembly systems require a ground connection to get accurate calculations. Some public utilities have restrictions on connections to ground for safety and circuit reliability reasons.

Another such monitoring system, is disclosed in U.S. Pat. No. 9,810,720 B2, issued on Nov. 7, 2017, and assigned to Cleaveland/Price Inc., the present assignee. The sensor assembly system monitors a power line that includes a plurality of phases without connecting to ground. It uses three sensor assemblies each comprising a first end, a second end, a voltage sensor, a current sensor, an analog to digital converter, and a sensor transceiver. The first end of each sensor assembly is electrically connectable to one of the phases of the power line and a second end is electrically connectable to another phase of the power line. Although the monitoring system disclosed in U.S. Pat. No. 9,810,720 B2 discloses a monitoring system without a connection to ground, it requires each sensor assembly to hang from both of its ends between the conductors of two of the phases. The monitoring system of U.S. Pat. No. 9,810,720 B2 is capable of measuring instantaneous current and voltage which are sampled at a specific rate. Also, any ground current and voltage can be calculated without connecting to ground. The said U.S. Pat. No. 9,810,720 B2, the said U.S. Pat. No. 9,664,710 B2, and the said U.S. Pat. No. 9,746,498 B2 are all herein incorporated by reference in their entireties as though fully set forth.

There is presently a need in the power utility industry for an alternative sensor assembly system for accurately monitoring three phase currents and voltages on a three phase power line without connection to ground that is simple, to install and provides good voltage accuracy, and is lower in cost than the aforementioned phase to phase system. It is the object of the present invention to develop such an alternative sensor assembly system.

SUMMARY OF THE INVENTION

An improved sensor assembly system and method with good voltage accuracy for monitoring a three phase high voltage power line without connecting to ground is disclosed. The improved sensor assembly system comprises three sensor assemblies each having a reference point end not connected to ground. All three sensor assemblies are electrically connected together at the reference point ends to create a substantially stable neutral common reference point, not connected to ground potential, that is at zero volts when all the three phases are at the same line voltage.

Each sensor assembly comprises a similar arrangement to the arrangement of the prior art sensor assemblies already mentioned. Each sensor assembly of the present invention comprises a first end, a second end, a voltage sensor, a current sensor, an analog to digital converter, and a sensor transceiver. The first end of each sensor assembly is electrically connectable to one of the phases of the power line. Although, unlike the already mentioned prior art sensor assemblies, the second end is electrically connectable to the substantially stable neutral common reference point, not connected to ground potential, that is at zero volts. The second ends, i.e., the reference point ends, of the sensor assemblies, are electrically connected together at a physical and electrical junction of the second ends. The voltage sensor measures a voltage in relation to its one connected phase of the power line and the common reference point at the reference point end. The current sensor is magnetically coupled to the one connected phase of the power line. The analog to digital converter receives a first signal from the voltage sensor, and receives a second signal from the current sensor. The first signal is proportional to the voltage on the one connected phase of the power line. The second signal is proportional to a current on the one connected phase of the power line. Moreover, the analog to digital converter samples the first signal to produce a digital voltage signal, and samples the second signal to produce a digital current signal representing the current on the one connected phase of the power line. The digital voltage signal is representative of the voltage. The sensor transceiver is electrically connected to the analog to digital converter that can wirelessly receive timing data from a common transceiver timing device of a common assembly, and wirelessly transmits the digital voltage signal and the digital current signal to the common transceiver. The digital voltage signal and the digital current signal comprise timing data related to the timing information. A common microprocessor of the common assembly uses timing signals synchronized for the plurality of phases to determine the net real time sum of the current of the plurality of phases to determine ground or neutral current and for determining instantaneous current and voltage between the plurality of phases.

Each sensor assembly of the present invention uses a voltage sensor such as a voltage divider which is a pair of resistors connected in series between a phase of the power line and the reference point end. The three sensor assemblies when electrically connected together at the reference point ends result in a "Y" connection configuration that provides good voltage accuracy. Since the sensor assembly system of the present invention is not connected to ground, it avoids any restrictions that utilities may have regarding connection to ground as already mentioned. The present sensor assembly system simplifies the installation of the sensor assemblies since no physical connection to ground is needed and the sensor assembly does not have to be supported by hanging the sensor assembly by both ends between the line conductors of two phases. Hanging the sensor assembly of the present invention to a line conductor by only one end is all that is necessary to support the sensor assembly. Furthermore, cost savings result from the fact that the overall high voltage resistor length of the voltage divider is shorter by a factor of 1.73 for the phase to neutral sensor assembly as compared to the phase to phase sensor assembly. This is due to the voltage of the phase to neutral mounting being 1.73 times less than the phase to phase mounting previously mentioned and disclosed in U.S. Pat. No. 9,810,720 B2. Also, the cost of the second end of the sensor assembly connection hardware to mount to a power line for the phase to phase sensor assembly arrangement is much greater and requires three of these connectors as compared to the single connection of three very small diameter cables from the second end of the phase to neutral sensor assemblies needing only one small connector. In addition, further benefits of the present invention are that a ground wire down the pole, the ground rod and their installation costs are totally eliminated when a ground connection is not required at the location of the sensor installation.

These and other aspects of the present invention will be further understood from the entirety of the description, drawings and claims.

BRIEF DESCRIPTION OF THE DRAWINGS

For a better understanding of the invention reference may be made to the accompanying drawings illustrative of the invention, in which.

DETAILED DESCRIPTION OF THE PARTICULAR EMBODIMENTS

Figure 1:
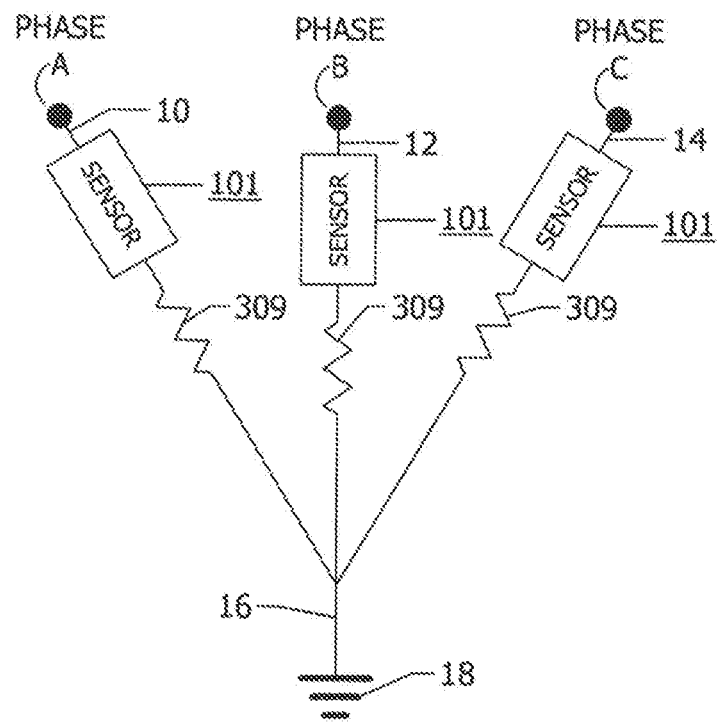
FIG. 1 is a schematic diagram of a power line monitoring system of the prior art connected in a "Y" configuration to ground.

With reference to FIG. 1, there is shown schematically a power line monitoring system as disclosed in the previously referenced U.S. Pat. No. 9,664,710 B2 and U.S. Pat. No. 9,746,498 B2 which sensor assemblies are connected in a "Y" configuration connected to ground. As can be seen in FIG. 1 there is a phase A—branch 10, a phase B—branch 12, and a phase C—branch 14. Each branch 10, 12 and 14 includes a sensor assembly 101 operatively connected in circuit to the respective phase A, phase B, or phase C of a power line. Each sensor assembly 101 includes a high voltage resistor 309. The three high voltage resistors are connected to a ground wire 16 which is connected to a ground potential reference point 18.

Figure 2:
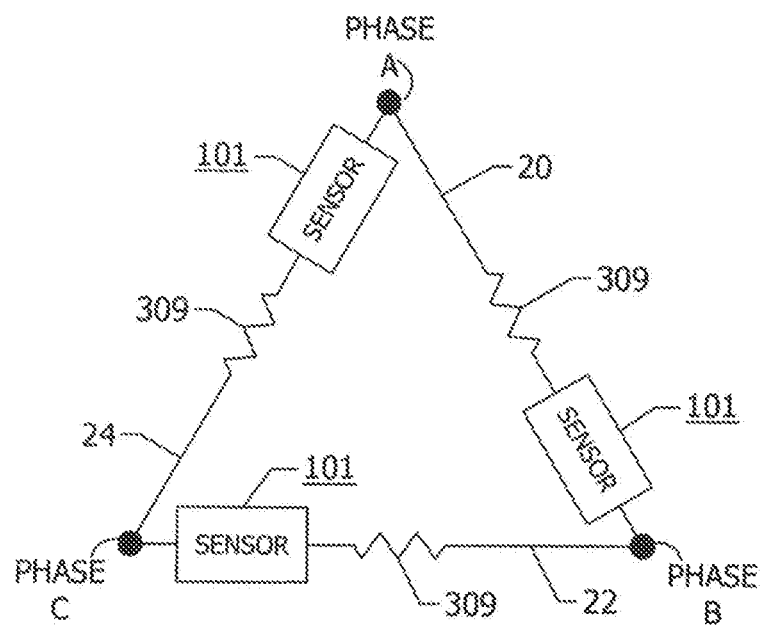
FIG. 2 is a schematic diagram of another power line monitoring system of the prior art connected in a delta configuration without connection to ground.

With reference to FIG. 2, there is shown schematically a power line monitoring system as disclosed in the previously referenced U.S. Pat. No. 9,810,720 B2. As can be seen in FIG. 2 the three phases also have three branches, i.e., phase A to phase B—branch 20, phase B to phase C—branch 22, and phase C to phase A—branch 24 which are connected in a delta configuration without connecting to ground. Each of the three branches 20, 22 and 24 includes a sensor assembly 101 operatively connected in circuit between two of the phases of a power line. Each sensor assembly 101 hangs by its ends to the two phases of the power line, not shown in the drawings. Each sensor assembly 101 includes a high voltage resistor 309. Each of the three high voltage resistors 309 are connected in the circuit between two of the phases of the power line.

Figure 3:
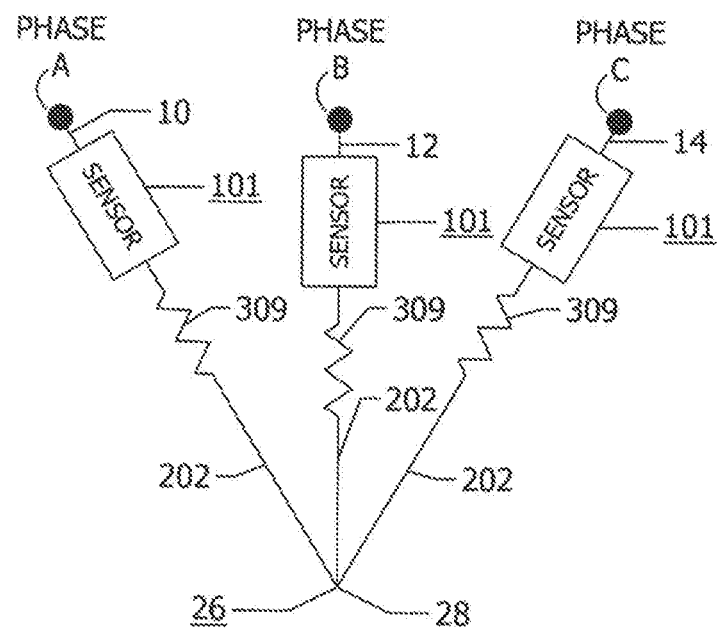
FIG. 3 is a schematic diagram of the power line monitoring system of the present invention connected in a "Y" configuration connected to a substantially stable neutral common reference point, that is not connected to ground potential.
Figure 7:
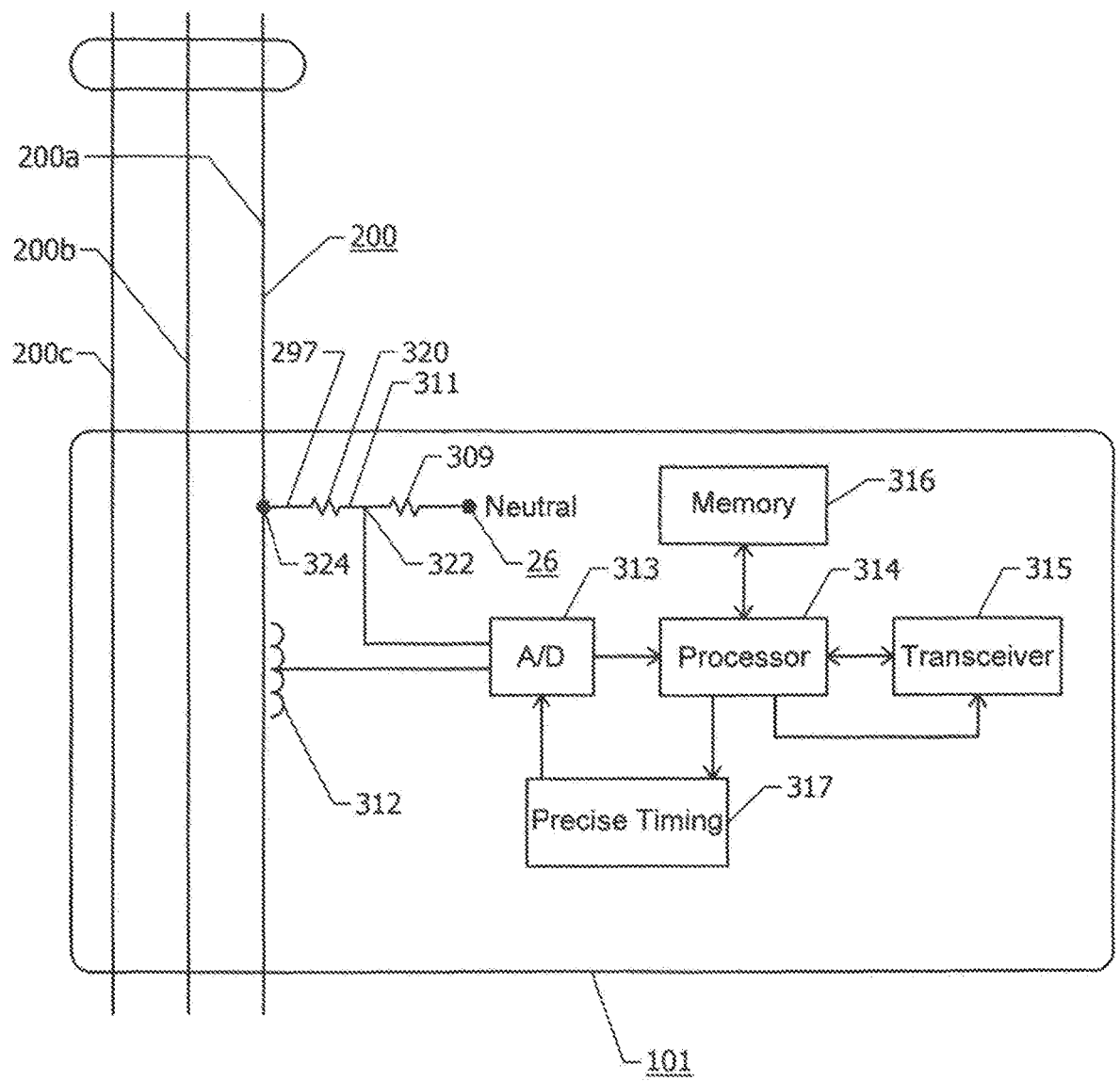
FIG. 7 is a schematic diagram of one of the sensor assemblies connected to a power line.

With reference to FIG. 3, there is shown schematically the improved power line monitoring system of the present invention with each of the sensor assemblies 101 connected in a "Y" configuration connected to a common reference point 26 which is not connected to ground. As can be seen in FIG. 3 there is also a phase A—branch 10, a phase B—branch 12, and a phase C—branch 14. Each branch 10, 12 and 14 includes a sensor assembly 101 operatively connected in circuit to the respective phase A, phase B, or phase C of a power line. Each sensor assembly 101 can include voltage sensor 311 which can be a voltage resistive divider 297 including a high voltage resistor 309, as shown in FIG. 7. The three high voltage resistors 309 are connected to the common reference point 26 which is not connected to ground at junction 28. Common reference point 26 is a substantially stable neutral connection point that is at zero volts when all three phases are at the same line voltage. The "substantially stable" neutral connection point allows voltage floating to occur. In other words, the voltage of the common reference point 26 that is obtained by connecting three ends of the resistors 309 together wavers from zero about ⅓ of the percentage that any particular phase's voltage varies from the other two phases, for example, if the three voltages are not the same. This may result in some voltage inaccuracy but most utility companies will find this acceptable. The fact that there is no ground connection is much more valuable to them, because the present invention will permit the utility companies to avoid the unwanted connections to ground, as previously mentioned.

Figure 4:
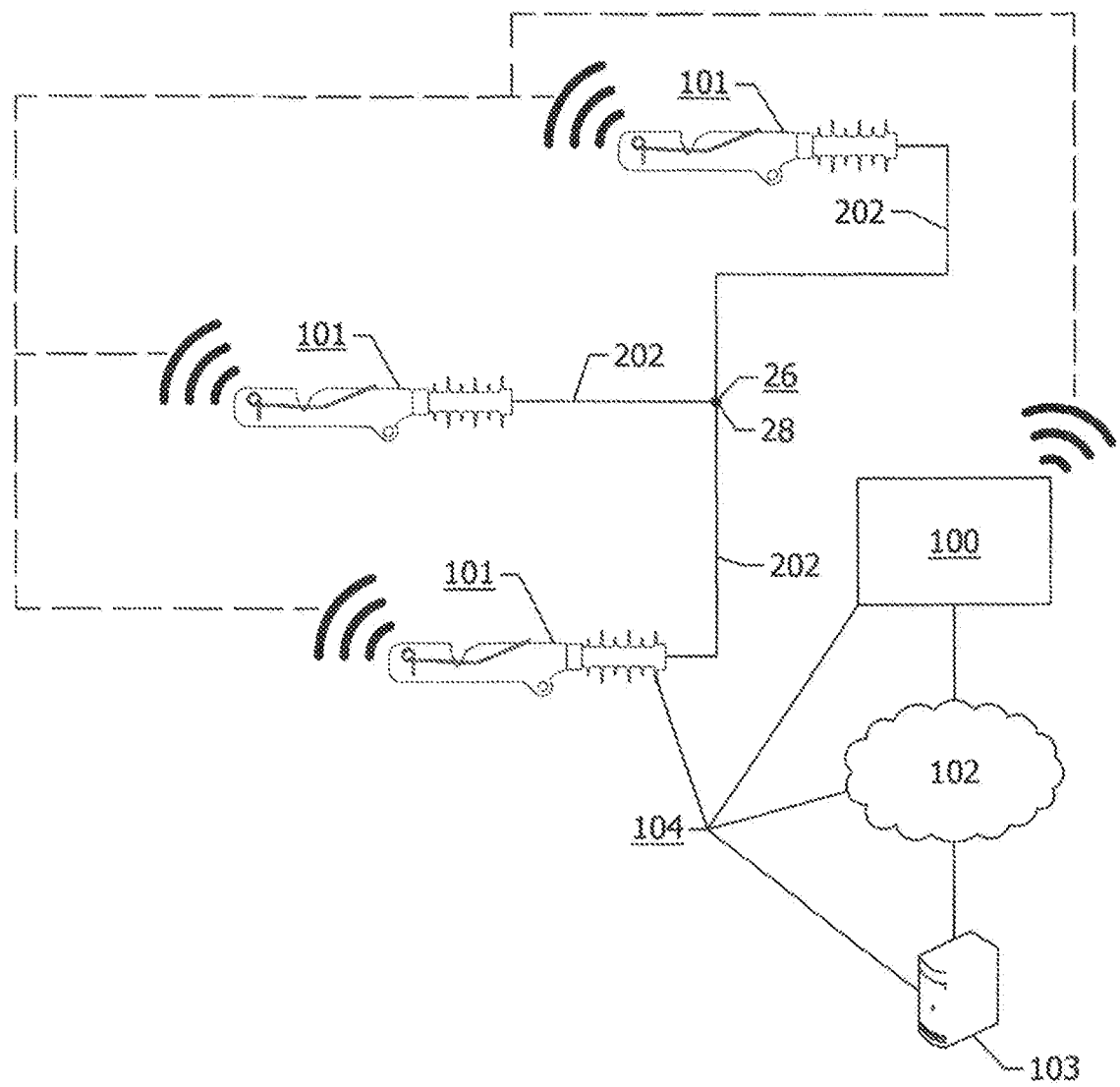
FIG. 4 is a schematic diagram showing the connection of the sensor assembly system basic components.

FIG. 4 shows schematically a power line monitoring system 104 of the present invention. Power line monitoring system 104 comprises a common assembly 100, three sensor assemblies 101, i.e., one for each phase, a network 102, and a monitoring computer 103. Each of the sensor assemblies 101 receives and sends data. Data can, in one embodiment, comprise an electrical signal. Once received, each sensor assembly 101 sends an electrical signal to common assembly 100. Common assembly 100 processes received data. Once processed, common assembly 100 can, in one embodiment, send data through network 102. Network 102 can be a local area network (LAN), a wide area network (WAN) or a combination of LANs, WANs. One illustrative LAN is a network within a single business. One illustrative WAN is the Internet. For the purposes of this disclosure, network 102 can comprise analog and digital cables.

Data in network 102 can be sent to and/or accessed by monitoring computer 103. Monitoring computer 103 can comprise any equipment capable of carrying out arithmetic and logic operations. Monitoring computer 103 can store and send out data information via network 102. Monitoring computer 103 can include, but is not limited to, a laptop and/or a mobile device. Once received, monitoring computer 103 can perform other operations on the data.

Figure 5:
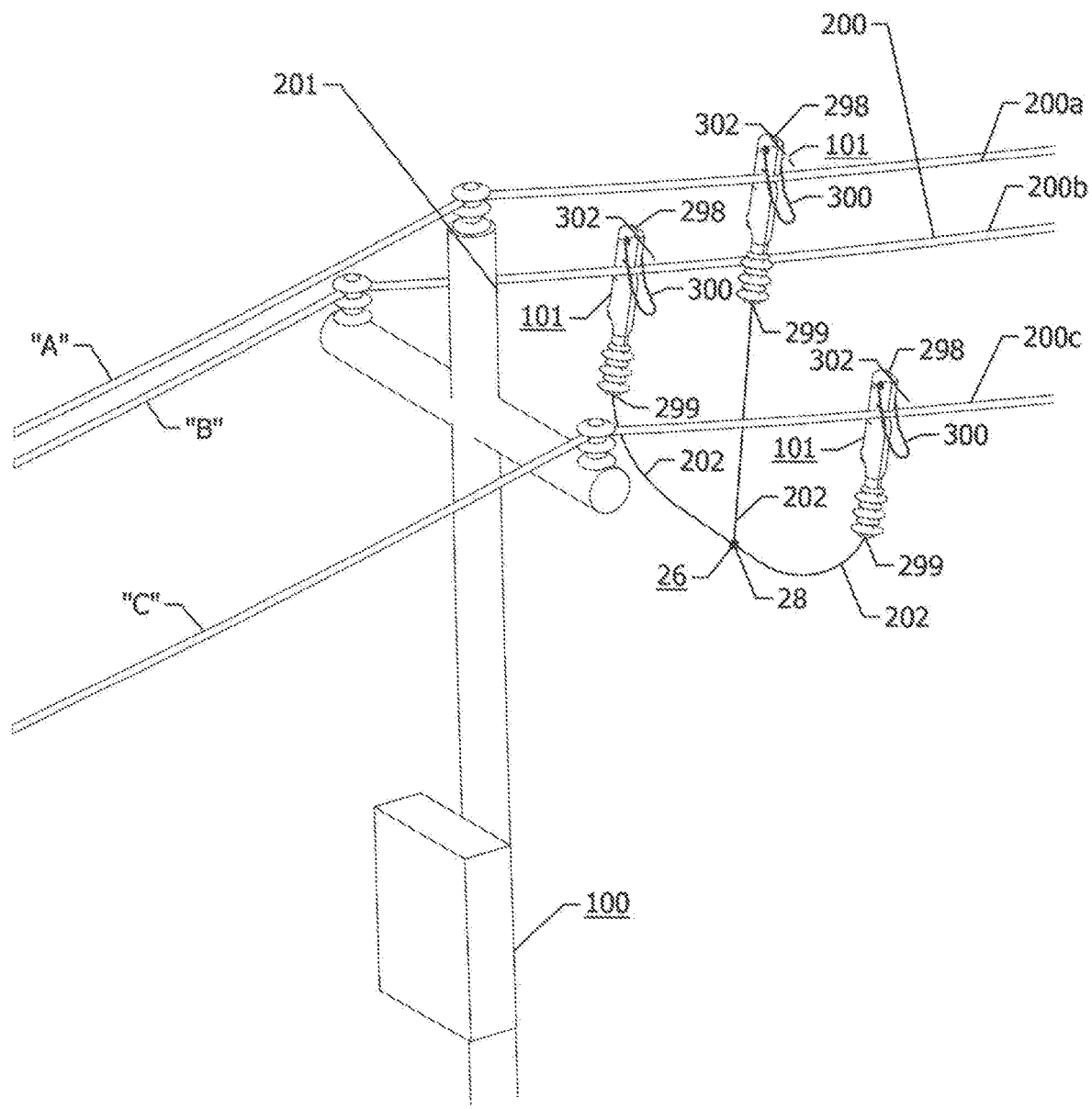
FIG. 5 is a perspective view showing the three sensor assemblies of the present invention attached to the power line.

FIG. 5 shows a power line monitoring system 104 of the present invention mounted to a utility pole 201 and a power line 200 consisting of phases A, B and C. Each sensor assembly 101 at one end 298 attaches directly to one of the power line conductors 200a, 200b, 200c, i.e., one of the phases of power line 200. The other end 299 of each sensor assembly 101 connects via reference point connection wire 202 to the electrically neutral common reference point 26, as shown in FIG. 3, through the high-voltage resistor 309. After connection to phases 200a, 200b and 200c of power line 200, each sensor assembly 101 monitors an electrical signal from power line 200, the electrical signal is proportional to the electricity flowing through power line 200. Each sensor assembly 101 can be powered by power line 200.

In one embodiment, common assembly 100 can be attached to utility pole 201, as shown in FIG. 5. Location of common assembly 100 at utility pole 201 allows common assembly 100, in near proximity to power line 200, to facilitate reception of wireless data from each sensor assembly 101. Common assembly 100 can then send data regarding the electrical current and voltage, for example, of power line 200 to network 102, see FIG. 4. Network 102 can then send and/or make data accessible to monitoring computer 103. In one embodiment, network 102 and monitoring computer 103 can be located separately from on-site power line 200 and/or utility pole 201. In one embodiment, communication between sensor assembly 101 and common assembly 100 can be wireless. In one embodiment, communication between network 102 and monitoring computer 103 can be wireless.

Figure 6:
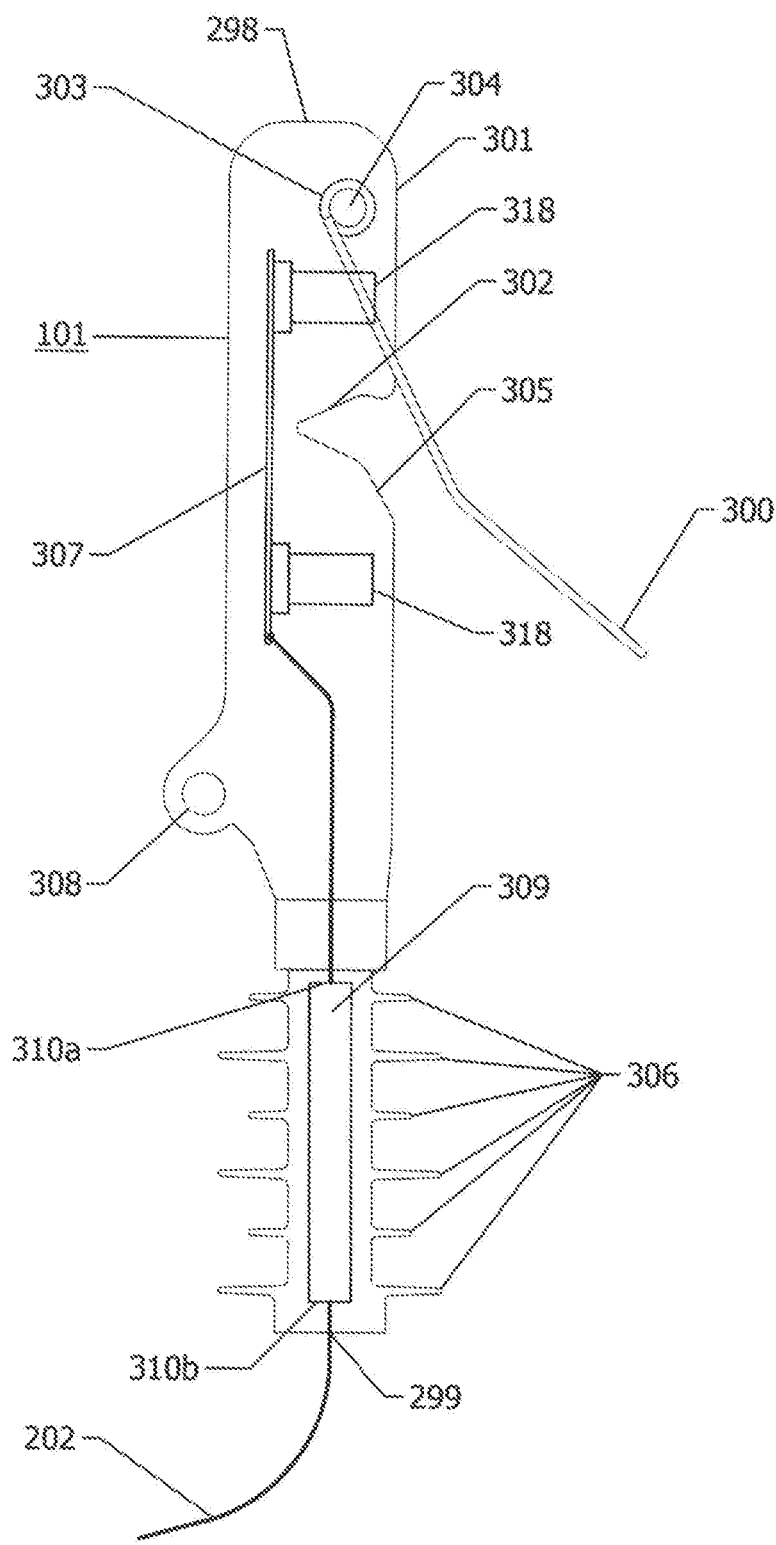
FIG. 6 is a side elevation view of the sensor assembly broken away to show internal components.

FIG. 6 shows a sensor assembly 101. In this embodiment, sensor assembly 101 can comprise a fastener 300. Fastener 300 can comprise a spring 303 and/or dowel 304. Sensor assembly 101 can also comprise an outer frame 301. The fastener 300 can be attached to one of the power line conductors 200a, 200b, or 200c, as shown in FIG. 5. The structure of outer frame 301 can comprise a concave insert 302, for receiving one of the conductors 200a, 200b, or 200c. Outer frame 301 can comprise a ramp 305 on a side adjacent to concave insert 302 for engaging one of the conductors 200a, 200b, 200c as shown in FIG. 5. Each sensor assembly 101 can comprise a plurality of fins 306 along the body 309 of outer frame 301. Fins 306 can increase the high-voltage creep distance for protecting insulation of sensor assembly 101.

Each of the sensor assemblies 101 can be capable of physical attachment at one end 298 of the sensor assembly 101 onto power line conductors 200a, 200b, or 200c by fastener 300. In one embodiment fastener 300 can comprise a single piece of wire, for example, which can be metallic. The fastener 300 can also be attached externally to outer frame 301 at spring 303. Spring 303 can be on opposing sides of outer frame 301. Spring 303 can be wrapped around dowel 304. Dowel 304 can be a protruding shaft molded into outer frame 301. The fastener 300 can produce tension by loading of spring 303 around dowel 304.

In one embodiment, outer frame 301 can comprise a shape accommodating the attachment of sensor assembly 101 onto one of the power line conductors 200a, 200b, or 200c. The shape of outer frame 301 can comprise the concave insert 302. Concave insert 302 can be a space or ridge in outer frame 301 shaped to fit around power line 200. The shape of concave insert 302 can allow outer frame 301 to grasp one of the power line conductors 200a, 200b, or 200c and act as a pocket capable of surrounding most of the surface of the grasped power line conductor.

In one embodiment, spring 303 can form a biased hinge. Spring 303 can allow fastener 300 to be capable of pushing one of the power line conductors 200a, 200b, or 200c into concave insert 302. The fastener 300 can comprise a bent, outward curve shape that can allow fastener 300 to catch one of the power line conductors. As a result, sensor assembly 101 can hang from a respective one of the power line conductors 200a, 200b, or 200c. In another embodiment, the outer frame can be shaped differently than the present embodiment and not require the use of fastener 300, spring 303, dowel 304 and ramp 305. The outer frame can be U-shaped and include a conductor receiving notch, not shown, in the drawings. The conductor receiving notch can be in operative arrangement with a hot stick driven screw clamp, not shown in the drawings, but similar to the clamping arrangement disclosed in the said U.S. Pat. No. 9,819,729 B2. The U-shaped outer frame can be lifted over the line conductor with a hot stick and lowered onto the line conductor and then the screw clamp can be tightened with the hot stick to lock the line conductor in place in the receiving notch, not shown in the drawings. Such a conductor fastening arrangement is disclosed in a publication of the present assignee, Cleaveland/Price Inc. in Cleaveland/Price Inc. Bulletin DB50C18, which is incorporated herein by reference as though fully set forth.

FIG. 6 shows an internal mechanical view of sensor assembly 101. Sensor assembly comprises a printed circuit board 307. Printed circuit board 307 can comprise a plurality of air core pickup coils 318. Once attached to one of the power line conductors 200a, 200b, or 200c, sensor assembly 101 can be capable of measuring current from the respective attached power line conductor via air core pickup coils 318. Printed circuit board 307 can be attached to a high voltage resistor 309 as shown in FIG. 6 for powering the circuit board 307.

The air core pickup coils 318 can be used to pick up current from the respective power line conductor 200a, 200b, or 200c. In one embodiment, the air core pickup coils 318 can be Rogowski coils. In one embodiment, concave insert 302 can be an aluminum part. As one of the power line conductors 200a, 200b, or 200c is captured by concave insert 302 it is held in the center of air core pickup coils 318, by fastener 300. Air core pickup coils 318 can be in phase with respect to a magnetic field centered between them. Air core pickup coils 318 are out of phase to a field from a distance, specifically in relation to other power line conductors, which they are not touching. Air core pickup coils 318 can provide a signal to printed circuit board 307 used for measuring current.

High voltage resistor 309 causes a small current, typically in the milliamp range, to flow through circuitry on printed circuit board 307, to concave insert 302 in contact with one of power line conductors 200a, 200b or 200c. High voltage resistor 309 comprises a first end 310a and a second end 310b. The sensor assembly 101 can comprise wiring capable of generating current for measuring voltage and power the circuit board 307. High voltage resistor 309 is highly resistive and capable of standing off the maximum expected surge voltage from the power line 200. In one embodiment, high voltage resistor 309 can be a variety of inches in length and may be made longer for higher voltage power lines 200, as an increasing in length of high voltage resistor 309 can result in a higher-ohm voltage resistor 309. In one embodiment, high voltage resistor 309 can be 8 inches long and ⅝ inch in diameter for an embodiment where power line 200 is 15 kilovolts (kV). In another embodiment, at 115 kV, the number of high voltage resistors 309 can be seven in series for the present invention, but can require twelve in series for the aforementioned phase to phase version of sensor assembly.

High voltage resistor 309 can be connected to printed circuit board 307 at one end 310a and further connected to reference point connection wire 202 at an opposing end 310b. The reference point connection wire 202 terminates at the reference point end 26, as can be seen by reference to FIGS. 4 and 5. As a result, voltage can be measured between the junction 28 at the reference point ends 26 point of high voltage resistor 309 and power line 200. Fins 306 can increase the electrical creep distance from power line 200 to high voltage resistor 309 and ultimately to reference point connection wire 202. As a result, the surface distance along the current's path can be increased, protecting insulation of sensor assembly 101.

A hot stick ring 308 can be attached on a side opposite of fastener 300 and/or concave insert 302, as shown for example in FIG. 6. Hot stick ring 308 can allow sensor assembly 101 to be attached to a hot stick, not shown in the drawings, which is commonly used for installation by people having ordinary skill in the art. By way of hot stick ring 308, an installer can elevate sensor assembly 101 so that one of the conductors 200a, 200b, or 200c of power line 200 contacts the ramp 305 of the outer frame 301. Ramp 305 can be an angled slope shaped along outer frame 301. As sensor assembly 101 can be pulled down, spring-loaded fastener 300 can extend until the respective power line conductor gets to ramp 305 that leads into concave insert 302. The downward force on sensor assembly 101 can cause the respective power line conductor of power line 200 to travel along the angle of ramp 305 and seat in concave insert 302.

In one embodiment, as shown in FIG. 6, fastener 300 can be attached as a loop at end 298 of sensor assembly 101. Fastener 300 can be a length that extends over and/or beyond concave insert 302. As a result, the frame of fastener 300 can be parallel to the edges of concave insert 302. In conjunction with fastener 300, in one embodiment, concave insert 302 can be positioned directly behind or beneath fastener 300. In one embodiment, fastener 300 can be pulled away from outer frame 301 in an open position and then clasped shut over one of the power line conductors of power line 200 at concave insert 302 in a closed position. As a result of tension, fastener 300 can be capable of grasping the clasped power line conductor and housing it within concave insert 302.

FIG. 7 depicts an internal schematic view of sensor assembly 101. Sensor assembly 101 comprises voltage sensor 311, current sensor 312, an analog to digital converter (A/D converter) 313, a sensor microprocessor 314, a sensor transceiver 315, a sensor memory 316 and a precise timing device 317. In one embodiment, voltage sensor 311 can be the voltage resistive divider 297 circuit having three connection points as shown in FIG. 7. Such voltage divider 297 circuit can comprise a small resistor 320 on printed circuit board 307 and high voltage resistor 309 connected to an output node 322 located between the small resistor 320 and the high voltage resistor 309, in one embodiment. The small resistor 320 is also connected to an input node 324 at the connection to the power line conductor 200a. The high voltage resistor 309 is also connected to the substantially stable neutral common reference point 26, also referred to as Neutral. In one embodiment, current sensor 312 can be one or more coils upon which power line 200 current can induce a coil current. Analog to digital converter 313 converts data from an analog format to a digital format. Sensor microprocessor 314 makes logical calculations, processes and transmits digital data, sends electrical signals to other parts of sensor assembly 101, and/or performs a variety of other computational functions. Sensor transceiver 315 wirelessly transmits and receives electronic data. Sensor memory 316 stores data and/or electronic signals away to be used or transmitted later at a specified time. Precise timing device 317 determines timing of the sending of a signal, such as for the synchronization of sensor assembly 101, which will be discussed more thoroughly below.

The voltage sensor 311 and the current sensor 312 read respectively line voltage and line current with respect to the attached power line conductor 200a, 200b or 200c of power line 200, and then transmit the voltage reading and current reading to A/D converter 313. In one embodiment, as already described voltage sensor 311 can be a voltage divider circuit, such as the shown voltage resistive divider 297 circuit. In one embodiment, current sensor 312 can be a Hall Effect Sensor or a coil. A/D converter 313 translates raw, analog data sampled into digital voltage data and/or digital current data. A/D convertor 313, in one embodiment, can sample voltage and current readings at least 16 samples per power line cycle. In another embodiment, analog to digital converter 313 can be capable of sampling voltage and current at a greater rate. Using timing information from precise timing device 317, A/D converter 313 can include timing data within or along with digital voltage and/or digital current data to microprocessor, hereinafter referred to as "digital data."

Sensor microprocessor 314 receives digital data. In one embodiment, sensor microprocessor 314 can filter the digital data received from A/D converter 313 using digital signal processing algorithms. Once filtered, raw data samples can be scaled to fit a digital format compatible with sensor transceiver 315. As necessary, sensor microprocessor 314 stores digital data and computations in memory 316.

Sensor microprocessor 314 sends digital data to transceiver 315. Transceiver 315 then sends digital data to common assembly 100. Transceiver 315 further receives precision timing data from common assembly 100. Transceiver 315 transmits the precision timing data to sensor microprocessor 314, which then sends precision timing data to precise timing device 317. In one embodiment, precise timing device 317 can be a separate device that receives a timing signal from sensor microprocessor 314 and sends a timing signal to A/D convertor 313. In one embodiment, precise timing device 317 can be built into sensor microprocessor 314. Precise timing device 317 provides timing information to analog to digital converter 313. Precise timing information is necessary to do calculations using digital data from multiple sensor assemblies 101, as will be discussed further below. Sensor microprocessor 314 sets sensor transceiver 315 to transmit or receive mode, acting as a control line for sensor transceiver 315.

Figure 8:
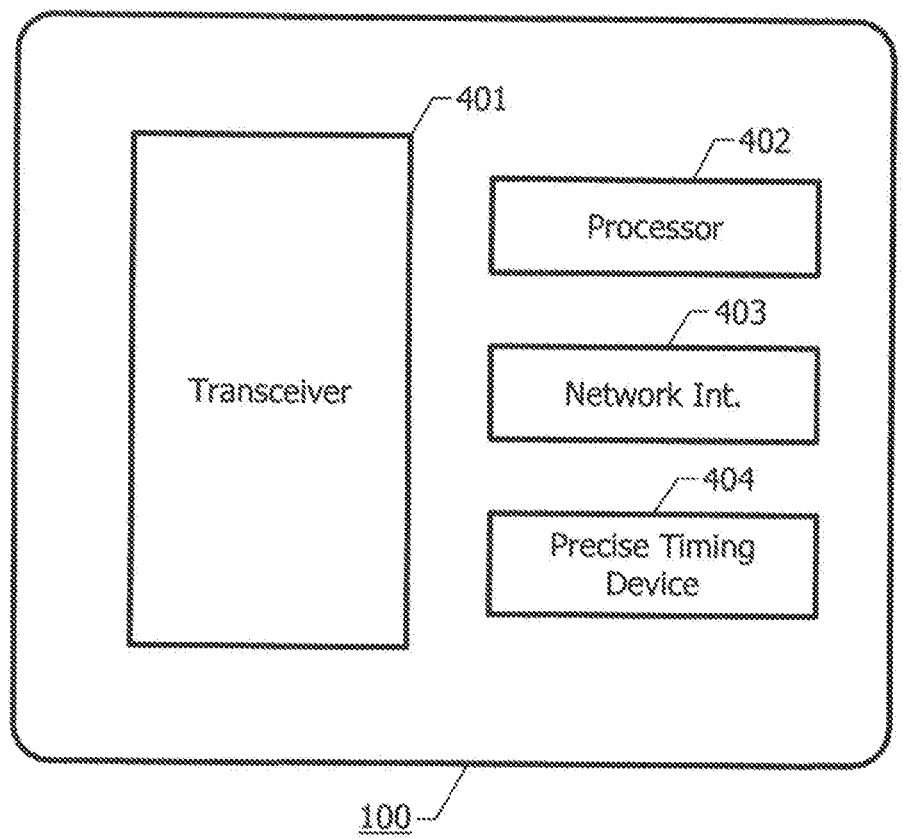
FIG. 8 is a schematic diagram showing the internal components of the common assembly: and, FIG. 9 is a graph of an experimental test of the present invention showing the voltages of three phases A, B and C of a power line where the voltage on phase A has been decreased relative to the voltage on phases B and C.

FIG. 8 shows schematically an internal view of common assembly 100. Common assembly 100 can comprise a common transceiver 401, a common processor 402, a networking interface 403, and a second precision timing device 404. Common transceiver 401 wirelessly transmits and receives electronic data between common assembly 100 and each sensor assembly 101. Furthermore, in one embodiment, common transceiver 401 can interface common assembly 100 with network 102, to communicate with monitoring computer 103. Common assembly 100 receives digital data and performs logical calculations on digital data from each sensor assembly 101. Specifically, common transceiver 401 sends digital data it receives from sensor transceiver 315, to common processor 402, in a format that common processor understands. Common processor 402 receives data from common transceiver 401. Common processor 402 can then make logical calculations, process and transmit digital data, send electrical signals to other parts of common assembly 100, and perform a variety of other computational functions. A second precise timing device 404 receives signals from microprocessor 402. Second precise timing device 404 creates a signal to send through common transceiver 401 to each sensor assembly 101 to synchronize each sensor assembly 101. Furthermore, network interface 403 can adapt common assembly 100 to another network 102 and/or monitoring computer 103.

The second timing device 404 sends data, which causes sensor assembly 101 to coordinate timing of when voltage data and current data is measured from the respective attached conductor 200a, 200b, or 200c of power line 200. Precise timing device 404 can receive data from processor 402 and resend signals through transceiver 401 to sensor assembly 101, in one embodiment. In another embodiment, precise timing device 404 can resend signals back through processor 402, which can then send data through common transceiver 401 and, ultimately back to sensor transceiver 315. With timing data from common precise timing device 404, each sensor assembly 101 is synchronized to each other to sample digital data simultaneously, for example. This synchronization can facilitate the comparison and analysis of wave forms for the voltage and current on each power line conductor, by common assembly 100. As a result, synchronization can allow for both current and voltage waves to be monitored precisely by common assembly 100. As discussed further below, synchronization can alert power line monitoring system 104 to any misalignments shown in the wave data information received.

Aside from data transfer, common microprocessor 402 can calculate digital information after receiving synchronized signals back from sensor assembly 101. Specifically, microprocessor 402 can calculate the root-means-square value (RMS) of the voltage and current, as well as ground current, in one embodiment. In one embodiment, common processor 402 can communicate calculations and waveform data received and processed to monitoring computer 103. Calculations can include, but are not limited to Fourier analysis, voltage and current total harmonic distortion (THD), phase angle between the current and voltage, power factor, wattage and VARS.

Furthermore, network interface 403 can allow common assembly 100 to transfer data and calculations from microprocessor 402 to network 102 and/or monitoring computer 103 associated with monitoring the power line conductors 200a, 200b, and 200c of power line 200. In one embodiment, the wave forms for the voltage and current of each phase and ground can be reconstructed at the common assembly 100. Furthermore, common assembly 100 and/or network 102 can transfer waveform data to monitoring computer 103 using a transient data exchange format, as described in IEEE Std. C37.111. The Institute for Electrical and Electronics Engineers, Inc. describes a standard data exchange format used for power systems and specifically defines an interchange of various types of fault, test, or simulation data for electrical power systems. Furthermore, the Institute describes sampling rates, filters, as well as sample rate conversions for data transfer.

In other embodiments, common assembly 100 may have other functions, such as repairing problems in power line 200. In one embodiment, common assembly 100 can operate a motor operated switch, not shown in the drawings, to shift power through the conductors of power line 200 or switch power to a capacitor bank for power factor control of the power line 200. In one embodiment, common assembly 100 can comprise a remote terminal unit.

In one embodiment, the sensor transceiver 315 and/or the common transceiver 401 comprising a frequency hopping spread spectrum (FHSS) radio can be used for communications between sensor assembly 101 and common assembly 100. Since the FHSS radios of each sensor assembly 101 can be synchronized as well as analog to digital converters 313 of each sensor assembly 101, the frequency hopping interval of 60 Hz can be used to synchronize analog to digital converters 313 to an exact multiple of the hopping frequency, in one embodiment. In one embodiment, the following rates can be appropriate for this scheme: frequency hopping rate of 60 Hz; raw analog to digital sampling rate of 64 samples/cycle or 3,840 samples/second; filtered sample rate of 16 samples/cycle or 960 samples/second; rate data is sent from each sensor assembly of 60 Hz; number of cycles of data sent each cycle of 1; size of each filtered sample of 16 bits. In one embodiment, the minimum data from each sensor assembly 101 in each cycle can include 512 bits (16 bits times 16 samples times 2 channels).

The voltage and current data sampled by sensor assembly 101 can be processed by common assembly 100 on a sinusoidal wave in phases, which can represent the cycle of the current and voltage movement along power line 200 over time, as discussed further below.

RMS values of the voltage and current can be calculated, as well as the relative power angle between voltage and current on the respective phase of power line 200, and the power factor for that phase. Furthermore, data can be represented as vectors, or points on a graph relating to time. Either manifestation of data can be used in facilitating calculations at any point in the signal chain.

Sensor assembly 101 can measure the phase currents at 16 bits times 16 samples in one embodiment. From one single conductor, a first wave, not shown in the drawings, can be measured representing voltage over time, while a second wave, not shown in the drawings, can be measured showing the levels of current over time. Points on first wave and second wave, not shown in the drawings, can represent the precise moments sensor assembly 101 took a reading to then yield wave patterns. As a result, voltage can be compared with current. After analyzing both, adjustments to power line 200 can be made as needed.

Once data samples are processed and transmitted, the actual waveforms of the currents and voltages can be recreated from power line 200. This data may be used by algorithms in common assembly 100 to calculate voltage and current root-mean-square (RMS), voltage and current total harmonic distortion (THD), power angle between the current and voltage, power factor, watts and VARS. The sample data from each of the three phase currents can be summed, yielding calculated samples of the neutral or ground current. The resulting data can be sent to monitoring computer 103. The common microprocessor 402 of the common assembly 100 analyzes the timed digital current signals synchronized for the three phases by determining the net real time sum of the current of the three phases to determine ground or neutral current and the common microprocessor 402 analyzes the timed digital voltage signals and the timed digital current signals synchronized for the three phases to determine instantaneous current and voltage between the three phases.

Using measurements from sensor assembly 101, microprocessor 402 can calculate, for example, phase differences between line conductors, and also phase shifts between voltage and current. These calculations can aid in the detection of power inefficiencies. Not only can power line monitoring system 104 calculate values on each individual power line conductor 200a, 200b and 200c of power line 200, but the power line monitoring system 104 can take calculations of the values of all power line conductors of power line 200 averaged together.

In one embodiment, one calculation on data samples can include Fourier analysis. Specifically, the Fourier analysis can represent any waveform by a set of sine waves. Any pure sine wave can be described by its magnitude and phase, including its size and how it relates to time. Waveform can be represented in two different ways. One way can include showing a collection of points on a graph relating to time, while another way can include showing a collection of vectors. In one embodiment, samples can be used to calculate magnitudes and vectors to facilitate calculations at any point in power line monitoring system 104. While Fourier analysis, in one embodiment, can take place in sensor assembly 101, in another embodiment, Fourier analysis can similarly take place in common assembly 100. In yet another embodiment, Fourier analysis can take place in both common assembly 100 and sensor assembly 101.

From analyzing the data of power line 200, e.g., the voltage data and current data from the same phase of power line 200, e.g., conductor 200a, power line monitoring system 104 can calculate power factor to determine whether the analyzed data representing conductor 200a is leading or lagging. Since sensor assembly 101 for voltage and current waves can be synchronized, this can indicate to an operator that a potential phase shift is occurring on power line 200 and producing imaginary power. As a result, an operator, common assembly 100, or power line monitoring system 104 can apply necessary remedies to power distribution, such as adding or removing a capacitor bank in one embodiment.

Sensor assembly 101 can simultaneously compare and measure current samples of each of the three phases of power line 200. In one embodiment where power line 200 is a 60 Hz system, sensor assembly 101 can sample each line 64 times per cycle, for example. Sensor assembly 101 can then send the values of these samples further down power line monitoring system 104 to produce a graph, for example, not shown in the drawings. The graph can indicate whether, for example, the detected current on two phases have equal amplitude with 120 degrees separation, loads on of power line 200 are then balanced, and there is no ground current.

Synchronization of sampling at power line 200 can allow the comparison of waveforms for the voltage and current on each of power line 200 conductors. As a result, common assembly 100 can achieve calculations crucial to monitoring power lines 200. For example, in one embodiment, synchronized data of three conductors of a three phase power line 200 can help determine ground or neutral current that can be computed as the net real time sum of the three phases of current. As a result of aligning the timing of three signals on power line 200 ground current can be calculated and the parameters for a balanced load among the voltage and current can be gauged.

Synchronization of measurements at sensor assembly 101 can allow monitoring system 104 to measure current and voltage levels in the same time frame. As multiple measurements taken by sensor assembly 101 can be synchronized, the sampling times of each analog to digital conversion can occur simultaneously. Without synchronized data, microprocessor 402 of common assembly 100 would be unable to calculate one phase's current relative to another phase's current or voltage. Specifically in an embodiment comprising a three-phase power line, if three signals are not aligned appropriately in time, then common assembly 100 cannot accurately calculate ground current.

Figure 9:
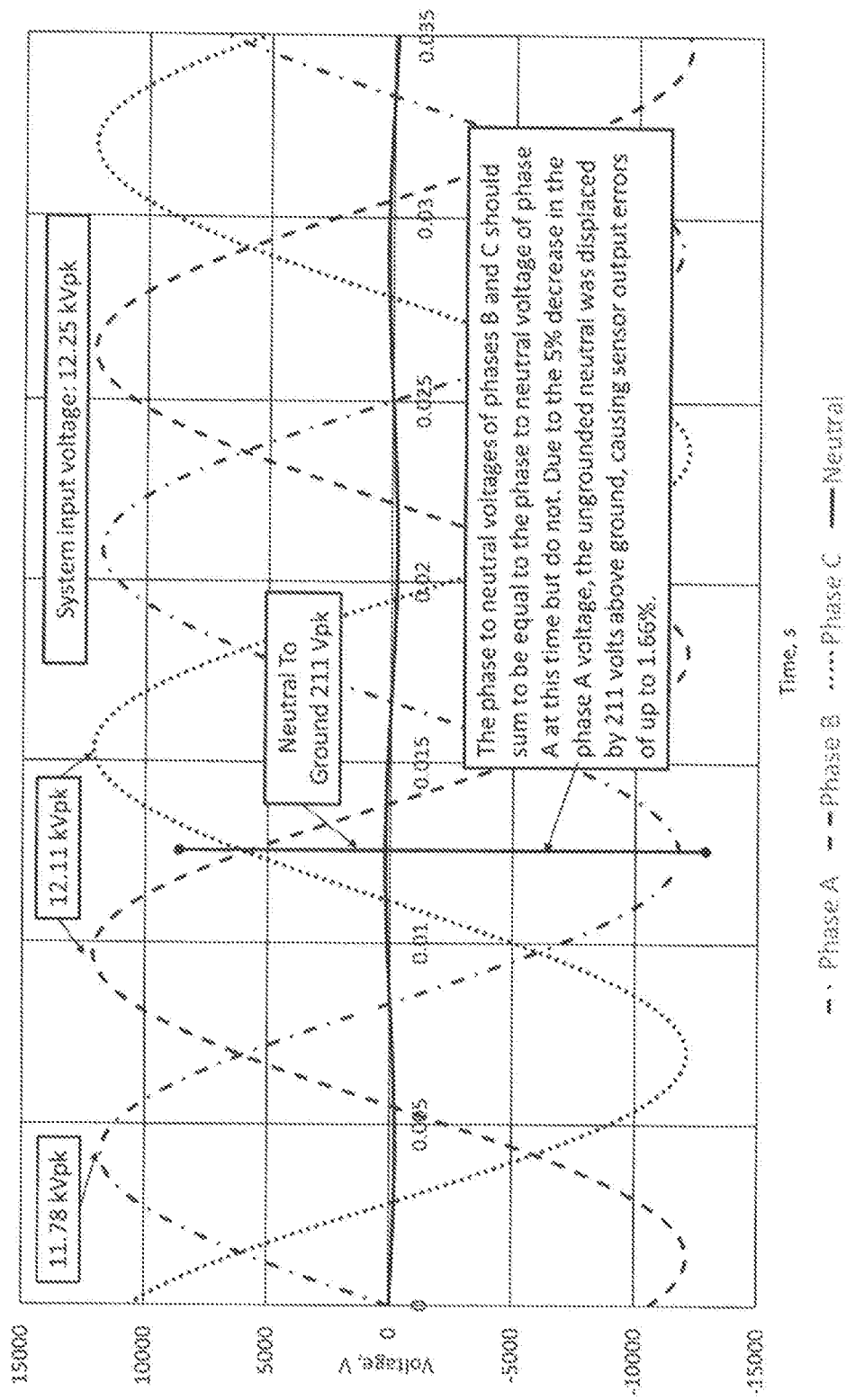

Experimental tests of the present invention were performed using a three phase power source that allowed variation of individual phase voltage. The tests compared a three phase ungrounded 15 kV sensor assembly system of the present invention to a Cleaveland/Price Inc. prior art sensor assembly system which included a normally grounded set of sensors, as disclosed for example in the previously mentioned U.S. Pat. No. 9,664,710 B2 or U.S. Pat. No. 9,746,498 B2, and to a Cleaveland/Price Inc. phase to phase sensor assembly system as disclosed in U.S. Pat. No. 9,819,729 B2. The Phase A voltage magnitude, in the experimental test, was varied 5 percent low. Refer to FIG. 9 which is a graph of the experimental test where Phase A voltage to neutral is 5% lower than phases B and C voltage to neutral. On a simulated three phase system using realistic circuit parameters, the normal phase to neutral voltage of 12.25 kV was modified by lowering the Phase A voltage to 11.6 kV, a 625 volt decrease or roughly a 5% drop compared to phases B and C. The Phase A voltage output wave from the sensor assembly 101 of the present invention in FIG. 9 then showed a decrease to only 11.78 kV or a 470 volt drop-off. Sensor assembly readings from Phases B and C also showed a change from 12.25 kV to 12.11 kV, a 140 volt drop. These disparities in sensor assembly outputs compared to the real voltage is due to the neutral moving in this particular test case from zero volts relative to ground to 211 volts. This is ⅓ of the total change of 625 volts or ⅓ of the 5% change mentioned earlier or 1.66% of the real voltage when the voltage of one phase was different from the other two phases. This neutral movement ultimately affects the accuracy of the voltage reading by that same ⅓ of the percentage change. In the test case just stated, the error in sensor assembly voltage readings were up to 1.66% compared to the real voltage when the voltage of one phase was different from the other two phases by 5%. The test showed that neither the phase to phase nor the ungrounded sensor assembly system of the present invention perform as well as the grounded sensor assembly system as disclosed in the said U.S. Pat. No. 9,664,710 B2 or U.S. Pat. No. 9,746,498 B2 issued to the present assignee, Cleaveland/Price Inc., for example. Although the ungrounded sensor assembly system of the present invention does not perform as well as the Cleaveland/Price Inc. grounded system, it was found that it still gives acceptable results, with the benefit of providing the ability to circumvent the previously mentioned connection to ground restrictions and is more economical for the reasons previously mentioned than the phase to phase ungrounded system as disclosed in the said U.S. Pat. No. 9,819,729 B2.

Various changes in the details of the illustrated operational methods are possible without departing from the scope of the following claims. Some embodiments may combine the activities described herein as being separate steps. Similarly, one or more of the described steps may be omitted, depending upon the specific operational environment the method is being implemented in. It is to be understood that the above description is intended to be illustrative, and not restrictive. For example, the above-described embodiments may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein."

What is claimed is:

1. A sensor assembly system for monitoring power lines of a three phase electrical power system, the sensor assembly system including:
    a plurality of sensor assemblies, each of the sensor assemblies comprising:
        a first end adapted to mount to and be in conductive electrical contact with a respective conductor of a power line of the three phase electrical power system, the respective sensor assembly to be powered by the respective conductor of the power line;
        a current sensor magnetically coupled to the respective power line conductor for measuring current;
        a voltage sensor in operative electrical connection with the respective power line conductor, the voltage sensor capable of measuring a voltage;
        an analog to digital converter configured to:
            receive a first signal from the voltage sensor, the first signal proportional to said voltage;
            receive a second signal from the current sensor, the second signal proportional to a current on the respective power line conductor;
            sample the first signal to produce a digital voltage signal, the digital voltage signal representing said voltage;
            sample the second signal to produce a digital current signal, the digital current signal representing the current on the respective power line conductor;
        a sensor transceiver in operative electrical connection with the analog to digital converter configured to wirelessly receive timing information from a precision timing device, and configured to transmit wirelessly the digital voltage signal and the digital current signal, the digital voltage signal and the digital current signal comprising timing data related to the timing information;
    a common assembly including:
        a common transceiver for receiving the timed digital voltage signal and the timed digital current signal from each of the plurality of sensor assemblies;
    the improvement which comprises:
        each of the sensor assemblies comprise a second end in operative electrical connection with a neutral common reference point not connected to ground potential at a junction of each second end of the plurality of sensor assemblies, the voltage sensor configured to measure a voltage between the respective power line conductor and the neutral common reference point not connected to ground potential.

2. The sensor assembly system of claim 1, wherein the voltage sensor comprises a voltage resistive divider having an input node and an output node, the input node in operative electrical connection with the respective power line conductor via the first end of the respective sensor assembly, a low voltage resistor in operative electrical connection between the input node and the output node, the output node of the voltage resistive divider in operative electrical connection with a first end of a high voltage resistor, a second end of the high voltage resistor in operative electrical connection with the second end of the respective sensor assembly.

3. The sensor assembly system of claim 1, wherein each of the sensor assemblies comprises an outer frame including an insert for receiving the respective power line conductor, the insert in conductive electrical contact with the respective power line conductor.

4. The sensor assembly system of claim 1, wherein said current sensor is a coil.

5. The sensor assembly system of claim 1, wherein said current sensor is a Hall effect sensor.

6. The sensor assembly system of claim 1, wherein said sensor transceiver is for sending a transceiver signal to the respective sensor assembly to sample the current on the respective power line conductor and to sample the voltage between the respective power line conductor and the neutral common reference point not connected to ground potential and for communicating with the common transceiver, the common transceiver capable of transmitting raw and filtered data samples to the common assembly.

7. The sensor assembly system of claim 6, wherein the sensor transceiver is for sending data to and receiving data from said common transceiver.

8. The sensor assembly system of claim 1, wherein the voltage sensor samples the voltage and the current sensor samples the current, both at a rate of at least 16 samples per power line cycle.

9. The sensor assembly system of claim 7, wherein said sensor transceiver communicates with a digital signal processing algorithm scaled to fit a digital format compatible with the common transceiver and the sensor transceiver.

10. The sensor assembly system of claim 7, wherein each of the sensor transceivers and the common transceiver further comprises a frequency hopping spread spectrum (FHSS) radio for communications between said sensor assembly and said common assembly.

11. The sensor assembly system of claim 1, further comprises means for sensing ground or neutral current and instantaneous current and voltage between the three phases of the electrical power system.

12. The sensor assembly system of claim 11, wherein the means for sensing ground or neutral current and instantaneous current and voltage between the three phases of the electrical power system comprises a microprocessor, the microprocessor for analyzing the timed digital current signals synchronized for the three phases by computing the net real time sum of the current of the three phases to determine ground current or neutral current and the microprocessor analyzing the timed digital voltage signal and the timed digital current signal synchronized for the three phases to determine instantaneous current and voltage between the three phases.

13. The sensor assembly system of claim 2, wherein the voltage resistive divider of each of the sensor assemblies is for generating current for measuring voltage and for powering a circuit board within the respective sensor assembly.

14. A method for a sensor assembly system to monitor power lines of a three phase electrical power system, the sensor assembly system including three sensor assemblies one for each of the three phases of the electrical power system, each of the sensor assemblies adapted to mount to and be in conductive electrical contact with a respective one of the conductors of a power line of the three phase electrical power system so as to be powered by the respective power line conductor, each of the sensor assemblies includes an analog to digital converter, a sensor transceiver electrically connected to the analog to digital converter, a sensor microprocessor connected in circuit with the analog to digital converter and the sensor transceiver, a voltage sensor in operative electrical connection with the respective power line conductor, the voltage sensor including a voltage resistive divider having an input node and an output note, the input node in operative electrical connection with the respective power line conductor, the output node connected to a reference point end of the respective sensor assembly through a high voltage resistor, the reference point ends of each of the sensor assemblies connected together to form a neutral common reference point not connected to ground potential, a current sensor for measuring current magnetically coupled to the respective power line conductor, a common assembly including a common transceiver operatively connected to a common precision timing device and a common microprocessor, the method comprising the following steps:

attaching each of the sensor assemblies capable of measuring voltage and current to a respective one of the power line conductors by mounting to the respective power line conductor via an outer frame including an insert for receiving the respective power line conductor, connecting the insert in conductive electrical contact with the respective power line conductor;

connecting the reference point ends of each of the sensor assemblies together to form the common neutral reference point not connected to ground potential;

formatting analog wave data sampled from the respective voltage sensor and current sensor of the respective power line conductor into digital parameters via the analog to digital converter;

the respective analog to digital converter receiving a first signal from the output node of the voltage sensor on the power line conductor, the first signal proportional to a voltage on the attached power line conductor, receiving a second signal from the current sensor, the second signal proportional to a current on the attached power line conductor;

sampling the first signal to produce a digital voltage signal, the digital voltage signal representing a voltage on the attached power line conductor;

sampling the second signal to produce a digital current signal, the digital current signal representing current on the attached power line conductor;

the sensor transceiver of the respective sensor assembly wirelessly receiving via the common transceiver a precision timing signal representative of timing information from the common precision timing device, and transmitting wirelessly the digital voltage signal and the digital current signal, the digital voltage signal and the digital current signal comprising timing data related to said timing information;

broadcasting the timed digital voltage signal and the timed digital current signal from each of the sensor transceivers of each of the sensor assemblies to the common transceiver on the common assembly;

monitoring the timed digital voltage and current signals synchronized in the same phase on the power line by the respective sensor assembly and the common assembly; and, determining the net real time sum of the current of the three phases to determine ground or neutral current by a microprocessor on the common assembly analyzing the timed digital voltage and current signals synchronized for the three phases by the microprocessor for computing instantaneous current and voltage between the three phases.

15. The method of claim 14, wherein each of said sensor transceivers is for sending data to and receiving data from the common transceiver of the common assembly.

16. The method of claim 15, wherein the common transceiver is further for sending filtered data samples to the common assembly.

17. The method of claim 14, wherein the sensor assemblies sample voltage and current at a rate of at least 16 samples per power line cycle.

18. The method of claim 14, wherein the sensor transceiver is for sending and receiving a digital signal processing algorithm scaled to fit a digital format compatible with said common transceiver and said sensor transceiver.

19. The method of claim 14, wherein each of the sensor transceivers and the common transceiver comprises a frequency hopping spread spectrum (FHSS) radio, wherein the frequency hopping spread spectrum radio is a radio for communications between the sensor assembly and the common assembly.

20. The method of claim 14, wherein the data transferred from the sensor assembly is for producing graphical representations of voltage and current levels.

21. The method of claim 14, wherein each of the sensor assemblies performs calculations via the respective sensor microprocessor comprising Fourier analysis.

22. The method of claim 14, wherein the common assembly performs calculations via the common microprocessor comprising Fourier analysis.

23. The method of claim 14, wherein the voltage resistive divider of each of the sensor assemblies is for generating current for measuring voltage and for powering a circuit board within the respective sensor assembly.

\* \* \* \* \*